US009963552B2

(12) United States Patent
Fukuda et al.

(10) Patent No.: US 9,963,552 B2
(45) Date of Patent: May 8, 2018

(54) CONDENSATION-CURABLE SILICONE RESIN COMPOSITION, CONDENSATION-CURABLE SILICONE RESIN CURED PRODUCT, AND SEALED OPTICAL SEMICONDUCTOR ELEMENT

(71) Applicant: SUMITOMO SEIKA CHEMICALS CO., LTD., Kako-gun, Hyogo (JP)

(72) Inventors: Noriaki Fukuda, Hyogo (JP); Katsumasa Yamamoto, Hyogo (JP)

(73) Assignee: Sumitomo Seika Chemicals Co., Ltd., Hyogo (JP)

( * ) Notice: Subject to any disclaimer, the term of this patent is extended or adjusted under 35 U.S.C. 154(b) by 93 days.

(21) Appl. No.: 14/911,621

(22) PCT Filed: May 26, 2014

(86) PCT No.: PCT/JP2014/063822
§ 371 (c)(1),
(2) Date: Feb. 11, 2016

(87) PCT Pub. No.: WO2015/025577
PCT Pub. Date: Feb. 26, 2015

(65) Prior Publication Data
US 2016/0194454 A1    Jul. 7, 2016

(30) Foreign Application Priority Data

Aug. 20, 2013 (JP) .................. 2013-170559
Dec. 6, 2013 (JP) .................. 2013-253170

(51) Int. Cl.
C08G 77/16 (2006.01)
C08G 77/26 (2006.01)
C08L 83/04 (2006.01)
C09J 183/08 (2006.01)
H01L 33/56 (2010.01)
C08G 77/388 (2006.01)

(52) U.S. Cl.
CPC ............. *C08G 77/26* (2013.01); *C08L 83/04* (2013.01); *C09J 183/08* (2013.01); *H01L 33/56* (2013.01); *C08G 77/16* (2013.01); *C08G 77/388* (2013.01)

(58) Field of Classification Search
CPC .......... C08L 83/04; C08G 77/26; C08G 77/16
See application file for complete search history.

(56) References Cited

U.S. PATENT DOCUMENTS 4,489,200 A    12/1984 Dziark
5,175,057 A    12/1992 Wengrovius et al.
5,712,391 A    1/1998 Ohno et al.
6,379,751 B1   4/2002 Schafer
7,297,745 B2 * 11/2007 Amidaiji .................. C08K 3/36
                                                      428/405
7,799,434 B2 *  9/2010 Webster ............... C08G 77/388
                                                      428/447
7,989,074 B2    8/2011 Webster
9,181,400 B2   11/2015 Fukuda
2006/0120011 A1  6/2006 Handa
(Continued)

FOREIGN PATENT DOCUMENTS

CN    1382183    11/2002
CN    1671916     9/2005
(Continued)

OTHER PUBLICATIONS

International Search Report issued in PCT/JP2014/063822 dated Jun. 17, 2014.

*Primary Examiner* — Margaret G Moore
(74) *Attorney, Agent, or Firm* — Hamre, Schumann, Mueller & Larson, P.C.

(57) ABSTRACT

The present invention aims to provide a condensation-curable silicone resin composition with excellent adhesion properties. The present invention also aims to provide a condensation-curable silicone resin cured product formed from the condensation-curable silicone resin composition and a sealed optical semiconductor element formed by using the condensation-curable silicone resin composition. The present invention is a condensation-curable silicone resin composition including: a condensation-curable silicone resin mixture; and an adhesion-imparting agent, the adhesion-imparting agent including a compound that includes at least one group A, wherein the group A is represented by the formula $$\begin{array}{c} \phantom{XX} \text{O} \phantom{XXXXXXX} \text{OH} \\ \phantom{XX} \diagdown\phantom{XX} \diagup \\ \phantom{XX} \text{C}-\text{O}-\text{R}^3-\text{CH} \\ \phantom{XX} \diagup \phantom{XXXXXXXXX} \diagdown \\ -\text{R}^{2a}\!-\!\!\left(\text{N}\!-\!\text{R}^{2b}\right)_{\!\!\overline{x}}\!\text{NH} \phantom{XXX} \text{R}^4 \\ \phantom{XX} \diagdown \phantom{XXXXXXX} \diagup \\ \phantom{XXXXX} \text{C}-\text{O} \phantom{XXX} \text{OH} \\ \phantom{XX} \diagup \phantom{XXXXXXXXX} \diagdown\phantom{XX} \diagup \\ \phantom{XXXX} \text{O} \phantom{XXXXXXXX} \text{R}^3-\text{CH} \\ \phantom{XXXXXXXXXXXXXXXXX} \diagdown \\ \phantom{XXXXXXXXXXXXXXXXXXX} \text{R}^4 \end{array} \quad (2)$$

wherein $R^{2a}$ represents a C1-C8 alkylene group in which a carbon atom other than a carbon atom bonded to a silicon atom is optionally partially substituted with an oxygen atom; $R^{2b}$'s each independently represent a C1-C3 alkylene group; $R_3$'s each independently represent a C1-C3 alkylene group; $R^4$'s each independently represent a hydrogen atom, a C1-C3 alkyl group, an OH group-containing C1-C3 alkyl group, or a halogen group; and x is an integer of 0 to 2.

4 Claims, No Drawings

(56) References Cited

U.S. PATENT DOCUMENTS

| | | |
|---|---|---|
| 2006/0122323 A1 | 6/2006 | Dumont et al. |
| 2007/0066730 A1 | 3/2007 | Chorvath |
| 2009/0258058 A1 | 10/2009 | Thomas et al. |
| 2011/0227235 A1 | 9/2011 | Yoshitake et al. |
| 2011/0248314 A1 | 10/2011 | Takei et al. |
| 2014/0256539 A1 | 9/2014 | Takei et al. |
| 2015/0284515 A1 | 10/2015 | Fukuda et al. |

FOREIGN PATENT DOCUMENTS

| | | |
|---|---|---|
| CN | 101478973 | 7/2009 |
| CN | 101885851 | 11/2010 |
| CN | 102131874 | 7/2011 |
| CN | 102190890 | 9/2011 |
| CN | 102234431 | 11/2011 |
| CN | 102246297 | 11/2011 |
| CN | 102627859 | 8/2012 |
| EP | 0 520 717 | 12/1992 |
| EP | 0 751 170 | 1/1997 |
| EP | 2 918 638 | 9/2015 |
| JP | 5-194857 A | 8/1993 |
| JP | 9-12889 A | 1/1997 |
| JP | 9-118827 A | 5/1997 |
| JP | 10-182827 | 7/1998 |
| JP | 2001-40286 A | 2/2001 |
| JP | 2001-131287 | 5/2001 |
| JP | 2004-359752 A | 12/2004 |
| JP | 2005-158762 | 6/2005 |
| JP | 2005-158764 | 6/2005 |
| JP | 2006-137797 | 6/2006 |
| JP | 2009-173789 | 8/2009 |
| JP | 2010-084118 | 4/2010 |
| JP | 2011-012144 | 1/2011 |
| JP | 2011-178983 | 9/2011 |
| JP | 2011-246693 | 12/2011 |
| JP | 2011-251936 A | 12/2011 |
| JP | 2012-012434 | 1/2012 |
| JP | 2012-41428 A | 3/2012 |
| JP | 2012-149131 | 8/2012 |
| JP | 2012-219113 A | 11/2012 |
| JP | 2013-010881 | 1/2013 |
| JP | 5548322 | 5/2014 |
| TW | 201319168 | 5/2013 |
| WO | 01/32766 | 5/2001 |
| WO | 2012/108609 | 8/2012 |
| WO | 2014/073341 | 5/2014 |

\* cited by examiner

CONDENSATION-CURABLE SILICONE RESIN COMPOSITION, CONDENSATION-CURABLE SILICONE RESIN CURED PRODUCT, AND SEALED OPTICAL SEMICONDUCTOR ELEMENT

TECHNICAL FIELD

The present invention relates to a condensation-curable silicone resin composition with excellent adhesion properties. The present invention also relates to a condensation-curable silicone resin cured product formed from the condensation-curable silicone resin composition and a sealed optical semiconductor element formed by using the condensation-curable silicone resin composition.

BACKGROUND ART

Condensation-curable silicone resins have been widely used as electronics materials such as potting materials or sealants for buildings. These resins react with moisture in the air and are cured by a condensation reaction to form rubber-like bodies, and exhibit adhesion to base materials in contact with the resins during curing. However, conventional condensation-curable silicone resins have a problem of poor adhesion to components of semiconductor materials. For example, when used for optical semiconductor devices, conventional condensation-curable silicone resins are poorly adhesive to PPA (polyphthalamide resin), which is a reflecting material, and the adhesion is further reduced due to heat from light-emitting devices or a temperature cycle, which is likely to cause separation of silicone resins from base materials.

In order to solve these problems of adhesion, blending of adhesion-imparting agents such as silane coupling agents is usually suggested. For example, Patent Literature documents 1 and 2 disclose methods of blending a silane coupling agent containing an amino group or a glycidyl group, and Patent Literature 3 discloses a method for improving adhesion to a base material by using a silane coupling agent containing an urea bond.

Patent Literature 4 discloses a method of primer treatment of a base material in order to improve adhesion.

However, blending of a silane coupling agent as disclosed in Patent Literature documents 1 to 3 does not sufficiently improve adhesion to a base material, and further has a drawback of poor durability, e.g., reduction in adhesion due to remarkable moisture absorption.

Furthermore, primer treatment as disclosed in Patent Literature 4 has a problem of increasing the number of steps, and is therefore not economical.

CITATION LIST

Patent Literature 1: JP H5-194857 A
Patent Literature 2: JP 2012-219113 A
Patent Literature 3: JP 2011-251936 A
Patent Literature 4: JP 2001-040286 A

SUMMARY OF INVENTION

Technical Problem

The present invention aims to provide a condensation-curable silicone resin composition with excellent adhesion properties. The present invention also aims to provide a condensation-curable silicone resin cured product formed from the condensation-curable silicone resin composition and a sealed optical semiconductor element formed by using the condensation-curable silicone resin composition.

Solution to Problem

One aspect of the present invention relates to a condensation-curable silicone resin composition including:
a condensation-curable silicone resin mixture; and
an adhesion-imparting agent,
the adhesion-imparting agent including a compound that includes a structural unit represented by the formula (1-3) and/or a structural unit represented by the formula (1-4) between a structural unit represented by the formula (1-1) and a structural unit represented by the formula (1-2):

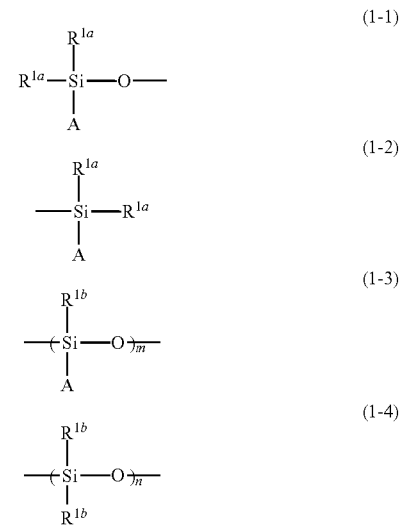

wherein $R^{1a}$'s in the formulas (1-1) and (1-2) each independently represent a C1-C18 alkyl group, a cycloalkyl group, an aryl group, or an aralkyl group; $R^{1b}$'s in the formulas (1-3) and (1-4) each independently represent a C1-C18 alkyl group, a cycloalkyl group, an aryl group, or an aralkyl group; m in the formula (1-3) is an integer of 1 to 50; n in the formula (1-4) is an integer of 1 to 1500; and A's in the formulas (1-1) to (1-3) each independently represent a C1-C18 alkyl group, a cycloalkyl group, an aryl group, an aralkyl group, or a group represented by the formula (2), provided that at least one of A's in the formulas (1-1) to (1-3) is a group represented by the formula (2):

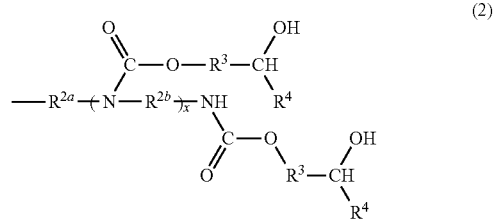

wherein $R^{2a}$ represents a C1-C8 alkylene group in which a carbon atom other than a carbon atom bonded to a silicon atom is optionally partially substituted with an oxygen atom; $R^{2b}$'s each independently represent a C1-C3 alkylene group;

$R^3$'s each independently represent a C1-C3 alkylene group; $R^4$'s each independently represent a hydrogen atom, a C1-C3 alkyl group, an OH group-containing C1-C3 alkyl group, or a halogeno group; and x is an integer of 0 to 2.

The present invention is described in detail below.

The present inventors found that a condensation-curable silicone resin composition with excellent adhesion properties can be obtained by blending a condensation-curable silicone resin mixture with a compound having a specific structure as an adhesion-imparting agent. Thus, the present invention has been completed.

The condensation-curable silicone resin composition of the present invention includes a condensation-curable silicone resin mixture.

The condensation-curable silicone resin mixture means a silicone resin which is in the form of liquid before curing and is cured to form a rubber elastomer while generating reaction by-products. Specifically, hydrolyzable groups such as alkoxy silyl groups or acetoxysilyl groups present in a polysiloxane are hydrolyzed with moisture in the air into silanol groups, and the silanol groups are condensed to form stable siloxane bonds to be crosslinked.

For example, reaction of an addition-curable silicone resin mixture generates almost no by-products, but curing inhibition may occur when a platinum catalyst, which is usually used as a cross-linking agent, is in contact with a compound containing sulfur, nitrogen, or phosphorus atom. Therefore, curing conditions need to be tightly controlled. On the other hand, the condensation-curable silicone resin mixture can be cured under curing conditions not tightly controlled.

A generally known one- or two-component condensation-curable silicone resin mixture may be used as the condensation-curable silicone resin mixture. The one-component condensation-curable silicone resin mixture may be of oxime type, alcohol type, acetone type, or acetic acid type. In particular, alcohol type and acetone type are preferred because they cause no corrosion of metals.

The two-component condensation-curable silicone resin mixture may be of alcohol type or acetone type.

In curing of the condensation-curable silicone resin mixture by a condensation reaction, tin, titanium, or an amine compound may optionally be used as a catalyst.

Examples of commercially available condensation-curable silicone resin mixtures include KE-3490, KE-3493, KE-3494, KE-3497, KE-3466, KE-3412, KE-3421, KE-3423, KE-3495 (all produced by Shin-Etsu Chemical Co., Ltd, one-component condensation acetone type); KE-4806-W, KE-4901-W, KE-4920T, KE-4920, KE-4921-B, KE-4921-W (all produced by Shin-Etsu Chemical Co., Ltd, one-component condensation alcohol type); and KE-200, KE-210 (all produced by Shin-Etsu Chemical Co., Ltd, two-component condensation acetone type).

The condensation-curable silicone resin composition of the present invention includes, as an adhesion-imparting agent, a silicone compound having a structural unit represented by the formula (1-3) and/or a structural unit represented by the formula (1-4) between a structural unit represented by the formula (1-1) and a structural unit represented by the formula (1-2) (hereinafter, also referred to as "the adhesion-imparting agent according to the present invention").

The structural units represented by the formulas (1-1) and (1-2) mean molecular ends.

The adhesion-imparting agent according to the present invention may be a block copolymer or a random copolymer.

One adhesion-imparting agent according to the present invention may be used or two or more adhesion-imparting agents may be used in combination.

$R^{1a}$'s in the formulas (1-1) and (1-2) each independently represent a C1-C18 alkyl group, a cycloalkyl group, an aryl group, or an aralkyl group. The phrase "each independently represent" herein means "may be the same as or different from one another".

Examples of the C1-C18 alkyl group represented by $R^{1a}$ include methyl, ethyl, n-propyl, isopropyl, n-butyl, isobutyl, tert-butyl, n-pentyl, neopentyl, tert-pentyl, n-hexyl, n-heptyl, 2,2,4-trimethylpentyl, n-octyl, isooctyl, n-nonyl, n-decyl, and n-dodecyl. In particular, methyl is preferred.

Examples of the cycloalkyl group represented by $R^{1a}$ include cyclopentyl, cyclohexyl, cycloheptyl, and methylcyclohexyl.

Examples of the aryl group represented by $R^{1a}$ include phenyl, tolyl, xylyl, ethylphenyl, and naphthyl. In particular, phenyl is preferred.

Examples of the aralkyl group represented by $R^{1a}$ include benzyl, α-phenylethyl, and β-phenylethyl.

In particular, $R^{1a}$ is preferably a C1-C18 alkyl group or an aryl group, more preferably methyl or phenyl.

$R^{1b}$'s in the formulas (1-3) and (1-4) each independently represent a C1-C18 alkyl group, a cycloalkyl group, an aryl group, or an aralkyl group.

Examples of the C1-C18 alkyl group represented by $R^{1b}$ include methyl, ethyl, n-propyl, isopropyl, n-butyl, isobutyl, tert-butyl, n-pentyl, neopentyl, tert-pentyl, n-hexyl, n-heptyl, 2,2,4-trimethylpentyl, n-octyl, isooctyl, n-nonyl, n-decyl, and n-dodecyl. In particular, methyl is preferred.

Examples of the cycloalkyl group represented by $R^{1b}$ include cyclopentyl, cyclohexyl, cycloheptyl, and methylcyclohexyl.

Examples of the aryl group represented by $R^{1b}$ include phenyl, tolyl, xylyl, ethylphenyl, and naphthyl. In particular, phenyl is preferred.

Examples of the aralkyl group represented by $R^{1b}$ include benzyl, α-phenylethyl, and β-phenylethyl.

In particular, $R^{1b}$ is preferably a C1-C18 alkyl group or an aryl group, more preferably methyl or phenyl.

In the formula (1-3), m is an integer of 1 to 50, preferably an integer of 2 to 45. In the formula (1-4), n is an integer of 1 to 1500, preferably an integer of 2 to 1400.

Here, when m and/or n represents 2 or more, $R^{1b}$'s in repeating units are the same as or different from one another.

A's in the formulas (1-1) to (1-3) each independently represent a C1-C18 alkyl group, a cycloalkyl group, an aryl group, an aralkyl group, or a group represented by the formula (2).

The C1-C18 alkyl group, the cycloalkyl group, the aryl group, and the aralkyl group represented by A are the same as those listed above for $R^{1a}$ and $R^{1b}$.

If the adhesion-imparting agent according to the present invention is free from the structural unit represented by the formula (1-3), all A's in the formulas (1-1) and (1-2) preferably represent a group represented by the formula (2) for favorable effects of improving adhesion.

$R^{2a}$ in the formula (2) represents a C1-C8 alkylene group in which a carbon atom other than a carbon atom bonded to a silicon atom is optionally partially substituted with an oxygen atom.

Examples of the C1-C8 alkylene group represented by $R^{2a}$ include methylene, ethylene, n-propylene, n-butylene, n-pentylene, n-hexylene, n-octylene, and a group obtained by substituting a carbon atom of each alkylene group with an oxygen atom. In particular, ethylene, n-propylene, n-butylene, n-pentylene, n-hexylene, and a group obtained by substituting a carbon atom of each alkylene with an oxygen atom are preferred.

$R^{2b}$'s in the formula (2) each independently represent a C1-C3 alkylene group.

Examples of the C1-C3 alkylene group represented by $R^{2b}$ include methylene, ethylene, n-propylene, and isopropylene.

When x in the formula (2) is 2, two $R^{2b}$'s may be the same as or different from one another.

$R^3$'s in the formula (2) each independently represent a C1-C3 alkylene group.

Examples of the C1-C3 alkylene group represented by $R^3$ include methylene, ethylene, n-propylene, and isopropylene.

When x in the formula (2) is 1 or more, $R^3$'s are the same as or different from one another.

$R^4$'s in the formula (2) each independently represent a hydrogen atom, a C1-C3 alkyl group, an OH group-containing C1-C3 alkyl group, or a halogeno group.

Examples of the C1-C3 alkyl group represented by $R^4$ include methyl, ethyl, n-propyl, and isopropyl.

Examples of the OH group-containing C1-C3 alkyl group represented by $R^4$ include hydroxymethyl and hydroxyethyl.

When x in the formula (2) is 1 or more, $R^4$'s are the same as or different from one another.

In the formula (2), x is an integer of 0 to 2, preferably an integer of 0 or 1.

The case in which x is 0 means the case in which $R^{2a}$ is directly bonded to a NH group.

The adhesion-imparting agent according to the present invention is preferably one in which, in the formula (2), $R^3$ represents methylene and $R^4$'s each independently represent a hydrogen atom or hydroxymethyl in terms of compatibility with the condensation-curable silicone resin mixture or material availability.

The lower limit of the functional group equivalent in the formula (2) of the adhesion-imparting agent according to the present invention is preferably 100, and the upper limit thereof is preferably 15,000. If the functional group equivalent in the formula (2) of the adhesion-imparting agent according to the present invention is less than 100, adhesion appropriate for the functional group equivalent in the group represented by the formula (2) may not be obtained or compatibility with the condensation-curable silicone resin mixture may decrease. If the functional group equivalent in the formula (2) of the adhesion-imparting agent according to the present invention is more than 15,000, the condensation-curable silicone resin composition with insufficient adhesion properties may be obtained.

The lower limit of the functional group equivalent in the formula (2) of the adhesion-imparting agent according to the present invention is more preferably 200, still more preferably 500, and the upper limit thereof is more preferably 12,000, still more preferably 10,000.

The functional group equivalent of the adhesion-imparting agent according to the present invention is defined as (molecular weight of adhesion-imparting agent)/(number of moles of carbamate group), and depends on the numbers of m and n.

The adhesion-imparting agent according to the present invention is produced, for example, by a method of reacting a silicone compound having a structural unit represented by the formula (3-3) and/or a structural unit represented by the formula (3-4) between a structural unit represented by the formula (3-1) and a structural unit represented by the formula (3-2) (hereinafter, also referred to as "amino group-containing silicone compound") with a cyclic carbonate compound represented by the formula (4) (hereinafter, also referred to as "cyclic carbonate compound").

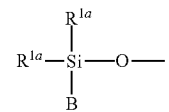

(3-1)

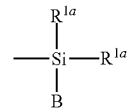

(3-2)

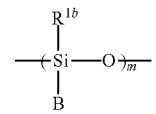

(3-3)

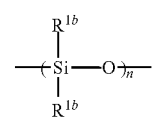

(3-4)

$R^{1a}$'s in the formulas (3-1) and (3-2) each independently represent a C1-C18 alkyl group, a cycloalkyl group, an aryl group, or an aralkyl group. $R^{1b}$'s in the formulas (3-3) and (3-4) each independently represent a C1-C18 alkyl group, a cycloalkyl group, an aryl group, or an aralkyl group. In the formula (3-3), m is an integer of 1 to 50, and in the formula (3-4), n is an integer of 1 to 1500. B's in the formulas (3-1) to (3-3) each independently represent a C1-C18 alkyl group, a cycloalkyl group, an aryl group, an aralkyl group, or a group represented by the formula (5), provided that at least one of B's in the formulas (3-1) to (3-3) is a group represented by the formula (5).

$R^{1a}$'s in the formulas (3-1) and (3-2) are the same as $R^{1a}$'s in the formulas (1-1) and (1-2), respectively. $R^{1b}$'s in the formulas (3-3) and (3-4) are the same as $R^{1b}$'s in the formulas (1-3) and (1-4), respectively.

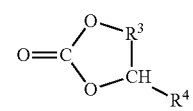

(4)

In the formula (4), $R^3$ represents a C1-C3 alkylene group, and $R^4$ represents a hydrogen atom, a C1-C3 alkyl group, an OH group-containing C1-C3 alkyl group, or a halogeno group.

$R^3$ in the formula (4) is the same as $R^3$ in the formula (2). $R^4$ in the formula (4) is the same as $R^4$ in the formula (2).

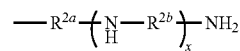

(5)

$R^{2a}$ in the formula (5) represents a C1-C8 alkylene group in which a carbon atom other than a carbon atom bonded to a silicon atom is optionally partially substituted with an oxygen atom, and $R^{2b}$'s each independently represent a C1-C3 alkylene group. In the formula (5), x is an integer of 0 to 2.

$R^{2a}$ in the formula (5) is the same as $R^{2a}$ in the formula (2), and $R^{2b}$'s in the formula (5) are the same as $R^{2b}$'s in the formula (2).

When x in the formula (5) is 2 or more, $R^{2b}$'s may be the same as or different from one another.

The amino group equivalent of the amino group-containing silicone compound corresponds to the above functional group equivalent of the adhesion-imparting agent according to the present invention. The functional group of the adhesion-imparting agent according to the present invention is a carbamate group (NHCOO).

The amino group equivalent of the amino group-containing silicone compound may be determined by, for example, non-aqueous neutralization titration using perchloric acid.

The number of moles of a carbamate group (NHCOO), which is a functional group contained in the adhesion-imparting agent according to the present invention, i.e., the functional group equivalent, can be calculated from the amino group equivalent of the amino group-containing silicone compound.

The amino group-containing silicone compound can be synthesized by a method involving a polycondensation reaction leading to incorporation of an alkyl amino group-containing dialkoxyalkyl silane unit into a siloxane chain, as disclosed in U.S. Pat. No. 3,355,424, U.S. Pat. No. 2,947,771, and U.S. Pat. No. 3,890,269. This reaction is usually carried out in the presence of an acid or alkali catalyst. This reaction can be performed as a polymerization reaction using a dialkoxyalkylsilane and a cyclic siloxane.

Examples of commercially available amino group-containing silicone compounds include KF-864, KF-865, KF-868, KF-857, KF-8001, KF-862 (monoamine type); KF-859, KF-393, KF-860, KF-880, KF-8004, KF-8002, KF-8005, KF-867, KF-869, KF-861 (diamine type); X-22-1660B-3, X-22-9409 (both ends amine type, side chain phenyl type), PAM-E, KF-8010, X-22-161A, X-22-161B, KF-8012, KF-8008 (both ends amine type) (all produced by Shin-Etsu Chemical Co., Ltd); and BY16-205, BY16-849, FZ-3785, BY16-872, BY16-213, FZ-3705 (all produced by Dow Corning Toray Co., Ltd).

Examples of the cyclic carbonate compound include the compound represented by the formula (6). In particular, in terms of easiness of the reaction or the performance, a cyclic carbonate compound in which $R^3$ in the formula (4) is methylene is preferred, and ethylene carbonate and glycerol carbonate are more preferred.

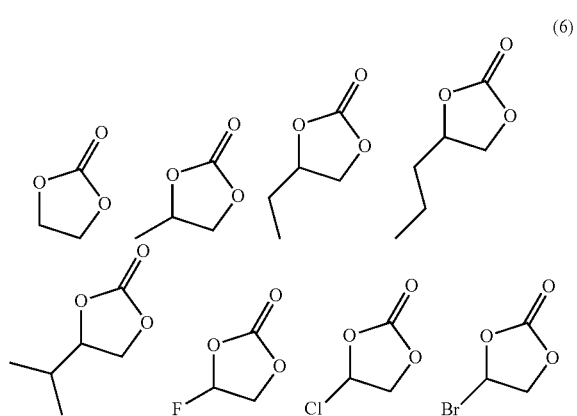

(6)

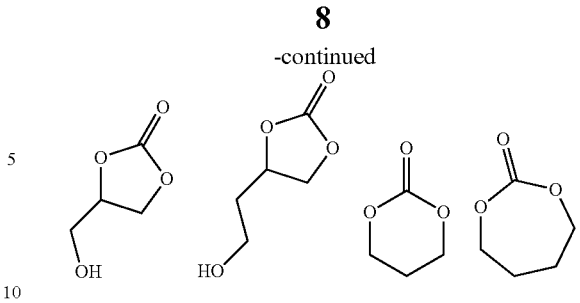

-continued

The amount of the cyclic carbonate compound used in the reaction of the amino group-containing silicone compound with the cyclic carbonate compound is preferably 0.5 to 10 mol, more preferably 0.8 to 5 mol, per mole of the amino group of the amino group-containing silicone compound.

The amino group herein is reactive with the cyclic carbonate compound, and is specifically a primary amino group or secondary amino group.

Reaction of the amino group-containing silicone compound with the cyclic carbonate compound may be carried out in the presence of a solvent. A solvent to be used is preferably an appropriately polar solvent easily dissolving the amino group-containing silicone compound. Examples of the solvent include benzene, toluene, xylene, chlorobenzene, dichlorobenzene, cyclohexane, dichloromethane, chloroform, diethyl ether, diisopropyl ether, acetone, ethyl methyl ketone, methyl isobutyl ketone, isopropanol, and butanol.

Reaction of the amino group-containing silicone compound with the cyclic carbonate compound is carried out preferably at a temperature in the range of 40° C. to 180° C. depending on the solvent to be used, more preferably at a temperature in the range of 80° C. to 160° C. without using a solvent.

The lower limit of the amount of the adhesion-imparting agent according to the present invention in the condensation-curable silicone resin composition of the present invention is preferably 0.01% by mass, and the upper limit thereof is preferably 15% by mass. The adhesion-imparting agent according to the present invention in an amount of less than 0.01% by mass may not sufficiently improve the adhesion. The adhesion-imparting agent according to the present invention in an amount of more than 15% by mass may adversely affect the hardness of the cured product. The lower limit of the amount of the adhesion-imparting agent according to the present invention is more preferably 0.1% by mass, still more preferably 0.3% by mass, and the upper limit thereof is more preferably 10% by mass, still more preferably 5% by mass.

In addition to the adhesion-imparting agent according to the present invention, the condensation-curable silicone resin composition of the present invention may contain any other adhesion-imparting agent as long as the object of the present invention is not inhibited.

The condensation-curable silicone resin composition of the present invention may optionally contain an additive in addition to the condensation-curable silicone resin mixture and the adhesion-imparting agent according to the present invention, as long as the object and the effects of the present invention are not impaired.

Examples of the additive include inorganic fillers, antioxidants, inorganic phosphors, lubricants, ultraviolet absorbers, heat and light stabilizers, dispersants, antistatic agents, polymerization inhibitors, antifoamers, curing accelerators, solvents, anti-aging agents, radical inhibitors, adhesion improvers, flame retardants, surfactants, storage stability improvers, antiozonants, thickeners, plasticizers, radiation shielding agents, nucleating agents, coupling agents, conductivity-imparting agents, phosphorus peroxide decomposers, pigments, metal deactivators, and physical property modifiers.

The inorganic fillers may be, but is not limited to, fine-particle fillers which do not deteriorate optical properties. Examples thereof include alumina, aluminum hydroxide, fused silica, crystalline silica, ultrafine amorphous silica, hydrophobic ultrafine silica, talc, calcium carbonate, and barium sulfate.

Examples of the inorganic phosphors include yttrium aluminum garnet (YAG) phosphors, ZnS phosphors, $Y_2O_2S$ phosphors, red emission phosphors, blue emission phosphors, green emission phosphors, which are widely used in LEDs.

The condensation-curable silicone resin composition of the present invention can be produced, for example, by mixing the condensation-curable silicone resin mixture, the adhesion-imparting agent according to the present invention, and optionally an additive.

The condensation-curable silicone resin composition of the present invention may be of one-component or two-component type.

The addition-curable silicone resin composition of the present invention can be used, for example, by applying to a base material such as an optical semiconductor device and curing.

The condensation-curable silicone resin composition of the present invention is applied to a base material by, for example, a method using a dispenser, potting, screen printing, transfer molding, or injection molding.

The condensation-curable silicone resin composition of the present invention can be cured at room temperature or by heating. Another aspect of the present invention relates to a condensation-curable silicone resin cured product prepared by curing the condensation-curable silicone resin composition of the present invention.

The final heating temperature for curing the condensation-curable silicone resin composition of the present invention is usually 100° C. or higher, preferably 120° C. or higher, more preferably 120° C. to 200° C., still more preferably 120° C. to 180° C.

The condensation-curable silicone resin composition of the present invention is used for, for example, a sealing material composition for electronic materials, a building sealant composition, a vehicle sealant composition, and an adhesive composition.

Examples of the electronic materials include supporting members such as a lead frame, a wired tape carrier, a wiring board, glass, and silicon wafer; an optical semiconductor device; active elements such as a semiconductor chip, a transistor, a diode, and a thyristor; passive elements such as a capacitor, a resistor, and a coil. In particular, the composition can be preferably used for a sealing material for an optical semiconductor device.

Another aspect of the present invention relates to a sealed optical semiconductor element in which an optical semiconductor device is sealed with the condensation-curable silicone resin cured product of the present invention.

The condensation-curable silicone resin composition of the present invention is also used for, for example, materials for displays, for optical recording media, for optical equipment, for optical parts, and for optical fibers; optical-electronic functional organic materials; and peripheral materials of semiconductor integrated circuits.

Advantageous Effects of Invention

The present invention can provide a condensation-curable silicone resin composition with excellent adhesion properties. The present invention can also provide a condensation-curable silicone resin cured product formed from the condensation-curable silicone resin composition and a sealed optical semiconductor element formed by using the condensation-curable silicone resin composition.

DESCRIPTION OF EMBODIMENTS

The present invention is explained in more detail below based on examples, but is not limited to these examples.

Production Example 1

(Reaction of Amino Group-Containing Silicone Compound with Ethylene Carbonate (Preparation of Adhesion-Imparting Agent A))

A 50-mL four-necked flask equipped with a magnetic stir bar, a thermometer, and a condenser was charged under a nitrogen atmosphere with 10.0 g (amino group 2.00 mmol) of an amino group-containing silicone compound ("KF-865" produced by Shin-Etsu Chemical Co., Ltd, amino group equivalent 5,000 g/mol) and 0.35 g (4.00 mmol) of ethylene carbonate (molecular weight 88.06). The contents were heated to 120° C. and stirred using a magnetic stirrer for 15 hours. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 9.3 g of a transparent liquid (adhesion-imparting agent A).

Measurement of the adhesion-imparting agent A by $^1$H-NMR confirmed that the adhesion-imparting agent A included a structural unit represented by the formula (1-1) ($R^{1a}$ is methyl, A is methyl), a structural unit represented by the formula (1-2) ($R^{1a}$ is methyl, A is methyl), a structural unit represented by the formula (1-3) ($R^{1b}$ is methyl, A is a group represented by the formula (2), $R^{2a}$ is n-propylene, x is 0, $R^3$ is methylene, $R^4$ is hydrogen), and a structural unit represented by the formula (1-4) ($R^{1b}$ is methyl).

Production Example 2

(Reaction of Amino Group-Containing Silicone Compound with Glycerol Carbonate (Preparation of Adhesion-Imparting Agent B))

A 50-mL four-necked flask equipped with a magnetic stir bar, a thermometer, and a condenser was charged under a nitrogen atmosphere with 10.0 g (amino group 2.00 mmol) of an amino group-containing silicone compound ("KF-865" produced by Shin-Etsu Chemical Co., Ltd, amino group equivalent 5,000 g/mol) and 0.47 g (3.95 mmol) of glycerol carbonate (molecular weight 118.09). The contents were heated to 120° C. and stirred using a magnetic stirrer for 15 hours. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 9.3 g of a transparent liquid (adhesion-imparting agent B).

Measurement of the adhesion-imparting agent B by $^1$H-NMR confirmed that the adhesion-imparting agent B included a structural unit represented by the formula (1-1) ($R^{1a}$ is methyl, A is methyl), a structural unit represented by the formula (1-2) ($R^{1a}$ is methyl, A is methyl), a structural unit represented by the formula (1-3) ($R^{1b}$ is methyl, A is a group represented by the formula (2), $R^{2a}$ is n-propylene, x is 0, $R^3$ is methylene, $R^4$ is hydroxymethyl), and a structural unit represented by the formula (1-4) ($R^{1b}$ is methyl).

Production Example 3

(Reaction of Silicone Compound Containing Phenyl and Amino Groups with Ethylene Carbonate (Preparation of Adhesion-Imparting Agent C))

A 50-mL four-necked flask equipped with a magnetic stir bar, a thermometer, and a condenser was charged under a nitrogen atmosphere with 5.0 g (amino group 2.27 mmol) of a silicone compound containing phenyl and amino groups ("X-22-1660B-3" produced by Shin-Etsu Chemical Co., Ltd, amino group equivalent 2,200 g/mol) and 1.0 g (11.4 mmol) of ethylene carbonate (molecular weight 88.06). The contents were heated to 120° C. and stirred for 15 hours using a magnetic stirrer. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 4.1 g of a transparent liquid (adhesion-imparting agent C).

Measurement of the adhesion-imparting agent C by $^1$H-NMR confirmed that the adhesion-imparting agent C included a structural unit represented by the formula (1-1) ($R^{1a}$ is methyl, A is a group represented by the formula (2), $R^{2a}$ is n-propylene, x is 0, $R^3$ is methylene, $R^4$ is hydrogen), a structural unit represented by the formula (1-2) ($R^{1a}$ is methyl, A is a group represented by the formula (2), $R^{2a}$ is n-propylene, x is 0, $R^3$ is methylene, $R^4$ is hydrogen), and a structural unit represented by the formula (1-4) ($R^{1b}$ is methyl or phenyl).

Production Example 4

(Reaction of Silicone Compound Containing Phenyl and Amino Groups with Glycerol Carbonate (Preparation of Adhesion-Imparting Agent D))

A 50-mL four-necked flask equipped with a magnetic stir bar, a thermometer, and a condenser was charged under a nitrogen atmosphere with 5.0 g (amino group 2.27 mmol) of a silicone compound containing phenyl and amino groups ("X-22-1660B-3" produced by Shin-Etsu Chemical Co., Ltd, amino group equivalent 2,200 g/mol) and 1.3 g (11.4 mmol) of glycerol carbonate (molecular weight 118.09). The contents were heated to 120° C. and stirred for 15 hours using a magnetic stirrer. The remaining amino groups were confirmed to be less than 1% by neutralization titration. Then, the reaction solution was transferred to a 200-mL four-necked flask equipped with a stirrer, a thermometer, and a condenser. To the solution were added 50 g of chlorobenzene and 50 g of water, and phase separation was performed. The organic phase was condensed to give 5.7 g of a transparent liquid (adhesion-imparting agent D).

Measurement of the adhesion-imparting agent D by $^1$H-NMR confirmed that the adhesion-imparting agent D included a structural unit represented by the formula (1-1) ($R^{1a}$ is methyl, A is a group represented by the formula (2), $R^{2a}$ is n-propylene, x is 0, $R^3$ is methylene, $R^4$ is hydroxymethyl), a structural unit represented by the formula (1-2) ($R^{1a}$ is methyl, A is a group represented by the formula (2), $R^{2a}$ is n-propylene, x is 0, $R^3$ is methylene, $R^4$ is hydroxymethyl), and a structural unit represented by the formula (1-4) ($R^{1b}$ is methyl or phenyl).

Examples 1 to 6, Comparative Examples 1 and 2

Ingredients in the amounts shown in Table 1 were uniformly mixed, and deaeration was sufficiently performed to prepare condensation-curable silicone resin compositions.

As the condensation-curable silicone resin mixture in Table 1, two-component condensation acetone-type silicone resin mixture ("KE-200" produced by Shin-Etsu Chemical Co., Ltd) was used.

As the adhesion-imparting agent E in Table 1, glycidoxypropyltrimethoxysilane ("Z-6040" produced by Dow Corning Toray Co., Ltd) was used.

<Evaluation>

The condensation-curable silicone resin compositions obtained in examples and comparative examples were evaluated as follows. Table 1 shows the results.

(1) Hardness (Type A)

Each of the condensation-curable silicone resin compositions obtained in examples and comparative examples was poured into a resin mold, and cured by allowing to stand at room temperature for one week. The resulting cured product was released from the mold, and formed into a test piece for hardness measurement with a radius of 20 mm and a thickness of 6 mm. The resulting test piece for hardness measurement was measured for hardness (Type A) using a hardness tester for rubber and plastics ("KR-24A" produced by KORI SEIKI MFG. CO., LTD.).

(2) Tensile-Shear Adhesion Strength to PPA (Polyphthalamide)

Each of the condensation-curable silicone resin compositions obtained in examples and comparative examples was poured between two PPA plates (size 2×25×100 mm) so that the composition had a thickness of 2 mm and the plates were bonded at a 20×25 mm rectangular area. The composition was cured by allowing to stand at room temperature for one week. Thus, a test piece for a tensile-shear test was prepared. The PPA plates used as base materials for adhesion were dried at 150° C. for one hour before use. The obtained test piece was measured for tensile-shear adhesion strength using a tensile tester ("AGS-X" produced by SHIMADZU CORPORATION) under the conditions of a distance between the clamps of 100 mm and a test speed of 5 mm/min.

TABLE 1

|  |  |  | Example 1 | Example 2 | Example 3 | Example 4 | Example 5 | Example 6 | Comparative Example 1 | Comparative Example 2 |
|---|---|---|---|---|---|---|---|---|---|---|
| Composition (part by mass) | Condensation-curable silicone resin mixture ("KE-200" produced by by Shin-Etsu Chemical Co., Ltd) | | 100 | 100 | 100 | 100 | 100 | 100 | 100 | 100 |
| | Adhesion-imparting agent | Adhesion-imparting agent according to the present invention | Adhesion-imparting agent A | 1 | 3 | — | — | — | — | — | — |
| | | | Adhesion-imparting agent B | — | — | 1 | — | — | — | — | — |
| | | | Adhesion-imparting agent C | — | — | — | 1 | 3 | — | — | — |
| | | | Adhesion-imparting agent D | — | — | — | — | — | 1 | — | — |
| | | Another adhesion-imparting agent | Adhesion-imparting agent E | — | — | — | — | — | — | — | 1 |
| Evaluation | Hardness (Type A) | | 25 | 25 | 25 | 25 | 25 | 25 | 25 | 25 |
| | Tensile-shear adhesion test for PPA | Tensile-shear adhesion strength (MPa) | 0.6 | 0.9 | 0.7 | 0.6 | 0.9 | 0.6 | 0.3 | 0.4 |

INDUSTRIAL APPLICABILITY

The present invention can provide a condensation-curable silicone resin composition with excellent adhesion properties. Furthermore, the present invention can provide a condensation-curable silicone resin cured product formed from the condensation-curable silicone resin composition and a sealed optical semiconductor element formed by using the condensation-curable silicone resin composition.

The invention claimed is:

1. A condensation-curable silicone resin composition comprising:
   a condensation-curable silicone resin mixture; and
   0.01% to 15% by mass of an adhesion-imparting agent,
   the adhesion-imparting agent including a compound that includes a structural unit represented by the formula (1-3) and/or a structural unit represented by the formula (1-4) between a structural unit represented by the formula (1-1) and a structural unit represented by the formula (1-2):

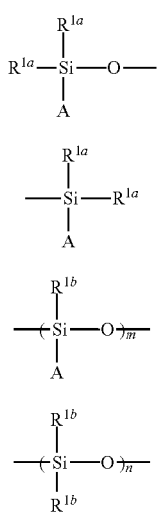

wherein $R^{1b}$'s in the formulas (1-1) and (1-2) each independently represent a C1-C18 alkyl group, a cycloalkyl group, an aryl group, or an aralkyl group; $R^{1b}$'s in the formulas (1-3) and (1-4) each independently represent a C1-C18 alkyl group, a cycloalkyl group, an aryl group, or an aralkyl group; m in the formula (1-3) is an integer of 1 to 50; n in the formula (1-4) is an integer of 1 to 1500; and A's in the formulas (1-1) to (1-3) each independently represent a C1-C18 alkyl group, a cycloalkyl group, an aryl group, an aralkyl group, or a group represented by the formula (2), provided that at least one of A's in the formulas (1-1) to (1-3) is a group represented by the formula (2):

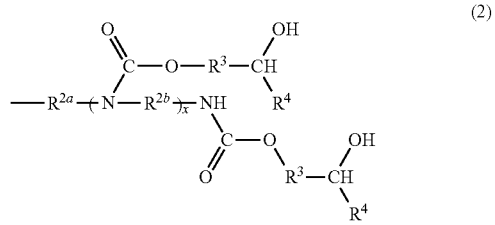

wherein $R^{2a}$ represents a C1-C8 alkylene group in which a carbon atom other than a carbon atom bonded to a silicon atom is optionally partially substituted with an oxygen atom; $R^{2b}$'s each independently represent a C1-C3 alkylene group; $R_3$'s each independently represent a C1-C3 alkylene group; $R^4$'s each independently represent a hydrogen atom, a C1-C3 alkyl group, an OH group-containing C1-C3 alkyl group, or a halogeno group; and x is an integer of 0 to 2.

2. The condensation-curable silicone resin composition according to claim 1,
   wherein, in the formula (2), $R^3$ represents methylene and $R^4$'s each independently represent a hydrogen atom or hydroxymethyl.

3. A condensation-curable silicone resin cured product prepared by curing the condensation-curable silicone resin composition according to claim 1.

4. A sealed optical semiconductor element in which an optical semiconductor device is sealed with the condensation-curable silicone resin cured product according to claim 3.

* * * * *

UNITED STATES PATENT AND TRADEMARK OFFICE
CERTIFICATE OF CORRECTION

PATENT NO. : 9,963,552 B2
APPLICATION NO. : 14/911621
DATED : May 8, 2018
INVENTOR(S) : Fukuda et al.

Page 1 of 1

It is certified that error appears in the above-identified patent and that said Letters Patent is hereby corrected as shown below:

In the Claims

Column 14, Line 22, Claim 1 delete "$R^{1b}$'s" and insert -- $R^{1a}$'s --.

Column 14, Line 49, Claim 1 delete "$R_3$'s" and insert -- $R^3$'s --.

Signed and Sealed this
Twenty-first Day of August, 2018

Andrei Iancu
*Director of the United States Patent and Trademark Office*